US010192978B2

(12) United States Patent
Okuda et al.

(10) Patent No.: US 10,192,978 B2
(45) Date of Patent: Jan. 29, 2019

(54) SEMICONDUCTOR APPARATUS

(71) Applicant: Mitsubishi Electric Corporation, Chiyoda-ku (JP)

(72) Inventors: Satoshi Okuda, Tokyo (JP); Akihiko Furukawa, Tokyo (JP); Tsuyoshi Kawakami, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/774,109

(22) PCT Filed: Oct. 6, 2016

(86) PCT No.: PCT/JP2016/079734
§ 371 (c)(1),
(2) Date: May 7, 2018

(87) PCT Pub. No.: WO2017/126167
PCT Pub. Date: Jul. 27, 2017

(65) Prior Publication Data
US 2018/0323294 A1 Nov. 8, 2018

(30) Foreign Application Priority Data
Jan. 19, 2016 (JP) .................. 2016-007858

(51) Int. Cl.
*H01L 29/861* (2006.01)
*H01L 29/739* (2006.01)
*H01L 27/06* (2006.01)
*H01L 29/40* (2006.01)

(52) U.S. Cl.
CPC ...... *H01L 29/7397* (2013.01); *H01L 27/0658* (2013.01); *H01L 27/0664* (2013.01); *H01L 29/407* (2013.01); *H01L 29/861* (2013.01)

(58) Field of Classification Search
CPC ............. H01L 29/7397; H01L 29/407; H01L 27/0658; H01L 27/0664; H01L 29/861
See application file for complete search history.

(56) References Cited

U.S. PATENT DOCUMENTS

2016/0336404 A1* 11/2016 Naito .................. H01L 29/7397
2016/0372585 A1   12/2016 Furukawa et al.

FOREIGN PATENT DOCUMENTS

JP        2013-251466 A    12/2013
WO    WO 2015/162811 A1    10/2015

OTHER PUBLICATIONS

International Search Report dated Dec. 20, 2016 in PCT/JP2016/079734 filed Oct. 6, 2016.

* cited by examiner

*Primary Examiner* — Kyoung Lee
(74) *Attorney, Agent, or Firm* — Oblon, McClelland, Maier & Neustadt, L.L.P.

(57) ABSTRACT

A semiconductor apparatus includes: a p-type base layer provided on a top surface side of an n-type drift layer; an n-type emitter layer provided on a top surface side of the p-type base layer; a first control electrode having a trench gate electrode embedded so as to reach from a surface layer of the n-type emitter layer to the n-type drift layer; a second control electrode having a trench gate electrode embedded so as to reach from the p-type base layer to the n-type drift layer; a p-type collector layer provided on a bottom surface side of the n-type drift layer; and a diode whose anode side and cathode side are connected to the first control electrode and the second control electrodes, respectively. It is possible to improve the controllability of dV/dt by a gate resistor.

12 Claims, 14 Drawing Sheets

F I G. 4
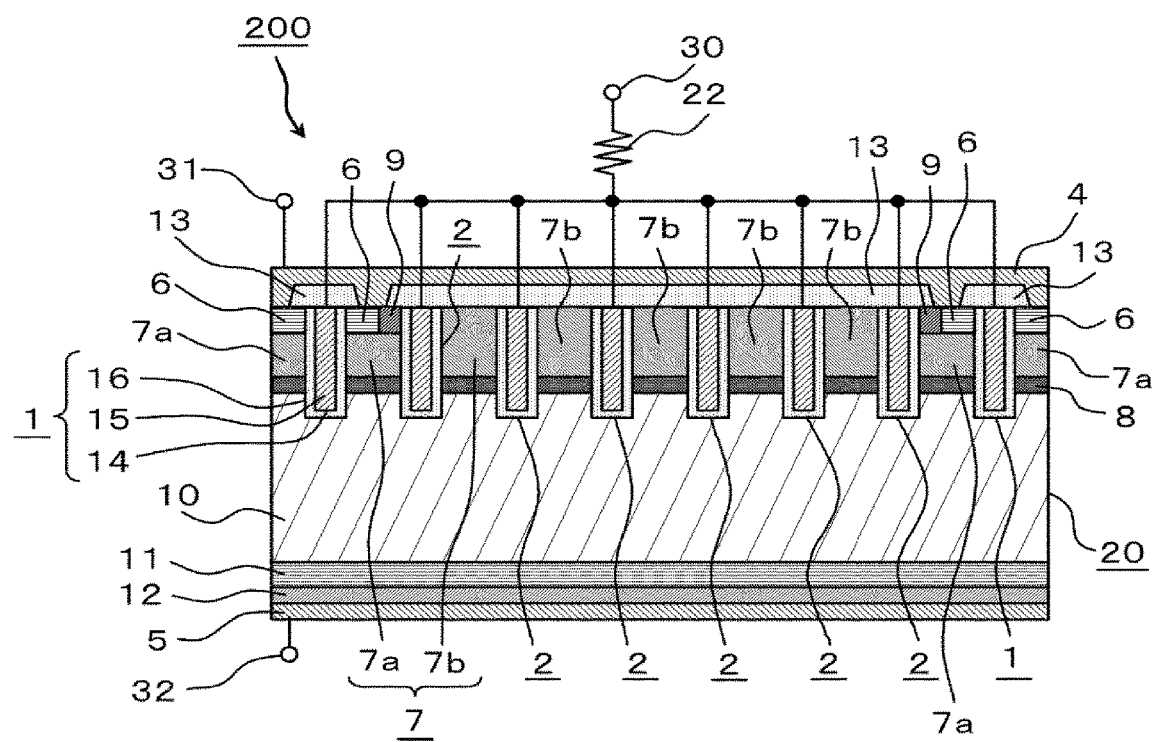

F I G. 1 4
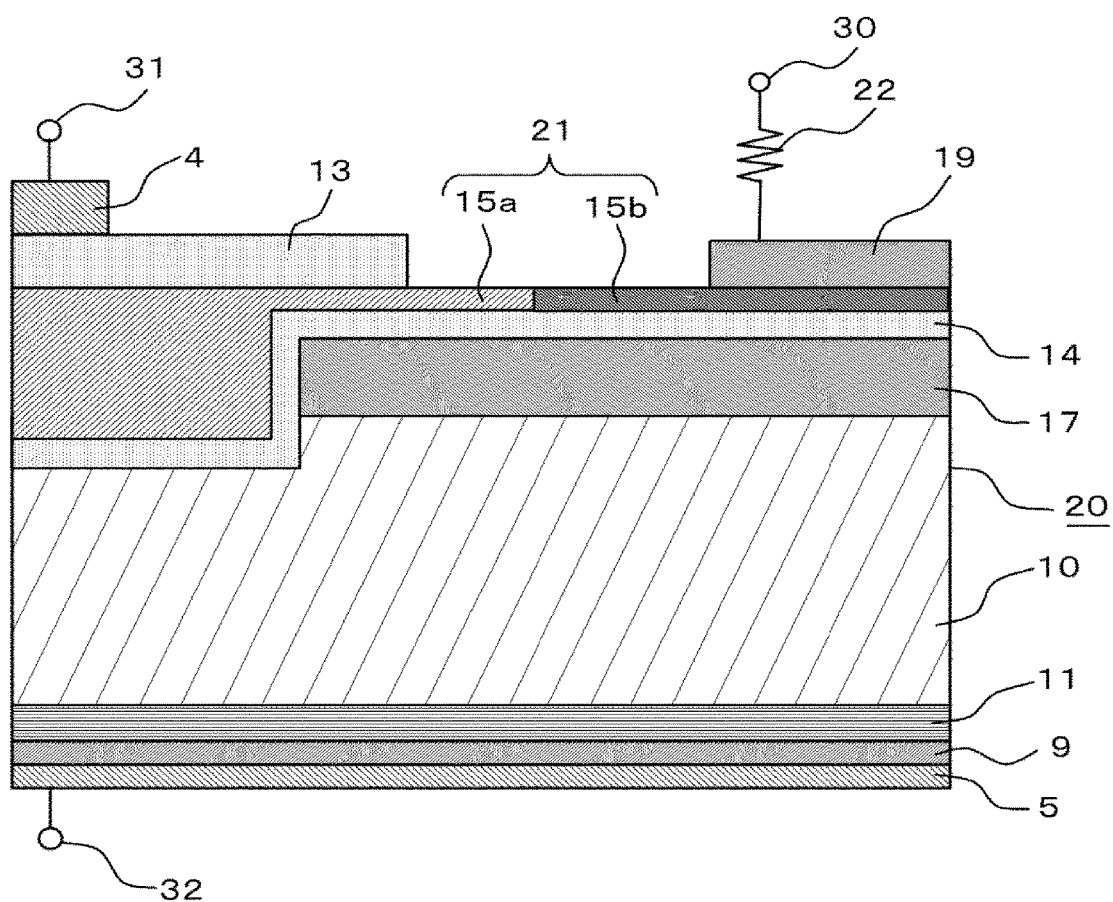

SEMICONDUCTOR APPARATUS

TECHNICAL FIELD

The present invention relates to a semiconductor apparatus including a trench gate.

BACKGROUND ART

Inverters for industrial use, home electric appliances, and the like include semiconductor apparatus such as a power module having a power semiconductor element mounted therein. Particularly, a semiconductor apparatus having a trench-gate type IGBT (Insulated Gate Bipolar Transistor) mounted therein is being widely used for its excellent controllability and energy saving.

The trench-gate type IGBT includes a trench gate that is formed in stripes on a surface of a semiconductor substrate having a p-type base layer formed on a surface layer portion of an n-type drift layer and is formed in such a manner as to penetrate the p-type base layer and reach the n-type drift layer. In contact with a side surface(s) of one or some of the trench gates, an n-type emitter layer is formed to form a channel in the p-type base layer on the side surface(s) of the trench gate(s) that is in contact with the n-type emitter layer. On the side surface(s) of the other trench gate(s), no n-type emitter layer is formed, to accumulate holes (positive holes) in the p-type base layer(s) in contact with the side surface(s) when the trench-gate type IGBT is switched on. The so-called dummy trench gate is a trench gate on a side surface of which no n-type emitter layer is formed and thus no channel is formed. On the other hand, the so-called active trench gate is a trench gate that has a channel formed on a side surface thereof and has a gate voltage applied thereto from a gate driving circuit. Further, the so-called active dummy trench gate is a particular dummy trench gate to which the gate voltage is applied from the gate driving circuit in the same manner as in the active trench gate.

In a trench-gate type IGBT as a conventional semiconductor apparatus, one or some dummy trench gates are connected to a gate terminal to be made into active dummy trench gates and the other dummy trench gate(s) is connected to an emitter terminal to be made into dummy trench gates. This has increased parasitic capacitance between a gate and a collector than in a case in which the active dummy trench gates are not connected to the gate terminal. Therefore, gate resistance is decreased to give rate of change in collector voltage with respect to time (dV/dt) at the time of turn-on of the IGBT, at the same level as conventional cases, thus decreasing a rate of change in collector current with respect to time (dI/dt) so that a turn-on loss has been reduced under a constant dV/dt (for example, see Patent Document 1).

PRIOR ART DOCUMENT

Patent Document

Patent Document 1: WO 2015/162811 A

SUMMARY

Problem to be Solved by the Invention

In a conventional semiconductor apparatus described in Patent Document 1, an active dummy trench gate as well as an active trench gate having a channel formed on a side surface thereof are connected to a gate terminal, so that it has been possible to decrease gate resistance when an IGBT is turned on at the identical dV/dt. Some of parasitic capacitance between a gate and a collector, however, are parasitic capacitance attributed to the active dummy trench gate, in which electric charge is accumulated, and a current produced by the electric charge charges capacitance between the gate and an emitter without passing a gate resistor at the time of turn-on of the IGBT, to sometimes excessively increase the dV/dt, giving a problem of deteriorating the controllability of the dV/dt by the gate resistor.

The present invention has been made to solve the problem described above, and an object of the present invention is to provide a semiconductor apparatus that suppresses the current that charges the capacitance between the gate and the emitter without passing the gate resistor and improves the controllability of the dV/dt by the gate resistor.

Means to Solve the Problem

A semiconductor apparatus according to the present invention includes: a first conductive type drift layer; a second conductive type base layer provided on a top surface side of the drift layer; a first conductive type emitter layer selectively provided on a top surface side of the base layer; a trench gate that allows a trench gate electrode to be in contact with the emitter layer, the base layer, and the drift layer via a gate insulating film, the trench gate electrode being embedded so as to reach from a surface layer of the emitter layer to the drill layer, a dummy trench gate that allows a dummy trench gate electrode to be in contact with the base layer and the drift layer via a gate insulating film, the dummy trench gate electrode being embedded so as to reach from a surface layer of the base layer to the drift layer; a second conductive type collector layer provided on a bottom surface side of the drift layer; and a diode whose anode side and cathode side are electrically connected to the trench gate electrode and the dummy trench gate electrodes respectively.

Effects of the Invention

The semiconductor apparatus according to the present invention suppresses the current that charges the capacitance between the gate and the emitter without passing the gate resistor, so that it is possible to improve the controllability of dV/dt by the gate resistor.

BRIEF DESCRIPTION OF DRAWINGS

FIG. 4 is an enlarged cross-sectional structure view illustrating an IGBT element constituting a conventional semiconductor apparatus.

FIG. 14 is an enlarged structure cross-sectional view illustrating an element peripheral portion of an IGBT element constituting a semiconductor apparatus according to a sixth embodiment of the present invention.

DESCRIPTION OF EMBODIMENTS

First Embodiment

Figure 1:
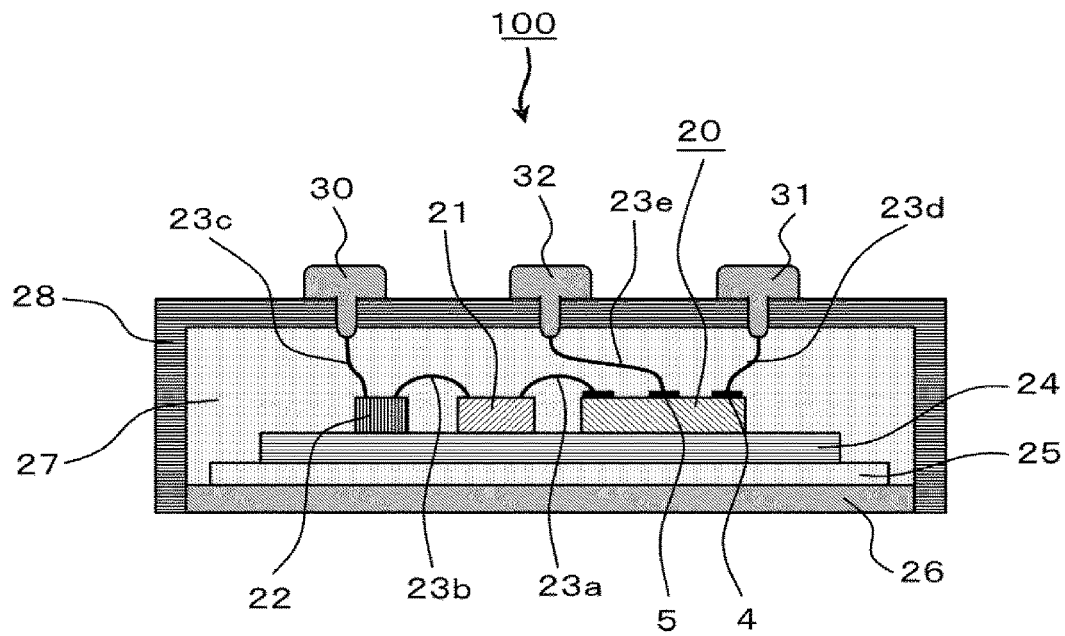
FIG. 1 is a schematic cross-sectional view illustrating a semiconductor apparatus according to a first embodiment of the present invention.

First described is a configuration of a semiconductor apparatus according to a first embodiment of the present invention. FIG. 1 is a schematic cross-sectional view illustrating the semiconductor apparatus according to the first embodiment of the present invention.

In the description below, n and p represent the conductive type of a semiconductor, and the present invention is described with a first conductive type and a second conductive type defined as an n-type and a p-type, respectively. In addition, n⁻ represents a lower impurity concentration than n, and n⁺ represents a higher impurity concentration than n. In the same manner, p⁻ represents a lower impurity concentration than p, and p⁺ represents a higher impurity concentration than p.

FIG. 1, a semiconductor apparatus 100 includes a trench-gate type IGBT element 20, a diode 21, and a gate resistor 22. The IGBT element 20, the diode 21, and the gate resistor 22 are joined onto an electrode (not shown) patterned and formed on a substrate 24. The substrate 13 is fixed onto an insulating member 25 formed of ceramics or a resin, the insulating member 25 is fixed onto a metal plate 26, such as copper or aluminum, having a high thermal conductivity, a case 28 entirely covers these components, and a sealing resin 27 is sealed in the case 28. Further, the case 28 is provided with a gate terminal 30, an emitter terminal 31, and a collector terminal 32 that are exposed outside the case 28. The IGBT element 20 is connected to the diode 21 by wiring 23a such as wire or a plate that is made of a metal material, such as copper of aluminum, having a high electric conductivity, and the diode 21 is connected to the gate resistor 22 by wiring 23b. Further, an emitter electrode 4 of the IGBT element 20 is connected to the emitter terminal 31 wiring 23d, and a collector electrode 5 of the IGBT element 20 is connected to the collector terminal 32 by wiring 23e. Furthermore, the gate terminal 30 is connected to the gate resistor 22 by wiring 23c.

The wiring 23a to 23e are not limited to wiring formed of wire or a plate as illustrated in FIG. 1, but may be wiring formed by patterning on the substrate 24. Further, a configuration of stacking the substrate 24, the insulating member 25, and the metal plate 26 is not limited to this example, but another configuration may also be employed, such as a configuration of directly joining the IGBT element 20 with the metal plate 26 to easily cool the IGBT element 20. Further, the semiconductor apparatus 100 may have a configuration of including no gate resistor 22 or may have a configuration of allowing a user to connect the gate resistor to the gate terminal for use.

Furthermore, the diode 21 and the gate resistor 22 may be formed in the IGBT element 20. Alternatively, the diode 21 may be formed in the IGBT element 20 and the gate resistor 22 may be provided by connecting to the gate terminal 30 outside the semiconductor apparatus 100.

Figure 2:
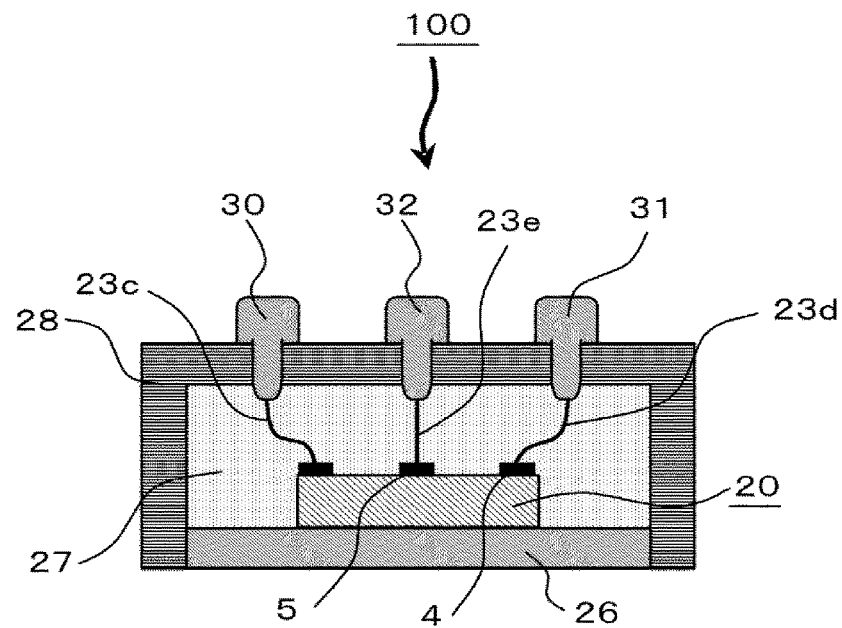
FIG. 2 is a schematic cross-sectional view illustrating another semiconductor apparatus according to the first embodiment of the present invention.

FIG. 2 is a schematic cross-sectional view illustrating another semiconductor apparatus according to the first embodiment of the present invention. In FIG. 2, a component having the same reference sign as the reference sign of a component in FIG. 1 has the identical configuration with or a configuration corresponding to the configuration of the component in FIG. 1, and the description for the component is omitted. FIG. 2 is a cross-sectional view illustrating a semiconductor apparatus 100 when the diode 21 and the gate resistor 22 are formed in the IGBT element 20 or when the diode 21 is formed in the IGBT element 20 and the gate resistor 22 is provided offside the semiconductor apparatus 100.

The collector electrode of the IGBT element 20 is joined with the metal plate 26 and the IGBT element 20 is fixed to the metal plate 26 and provided in the case 28. The sealing resin 27 is sealed in the case 28. The IGBT element 20 has the diode and the gate resistor, or only the diode incorporated therein. These diode and the gate resistor can be integrally formed with the IGBT element 20 in a semiconductor process. For example, it is possible to form a diode by forming a pn junction in a gate wiring position in the IGBT element 20, and it is possible to form a gate resistor by adjusting the impurity concentration of the gate wiring portion in the IGBT element 20.

Figure 3:
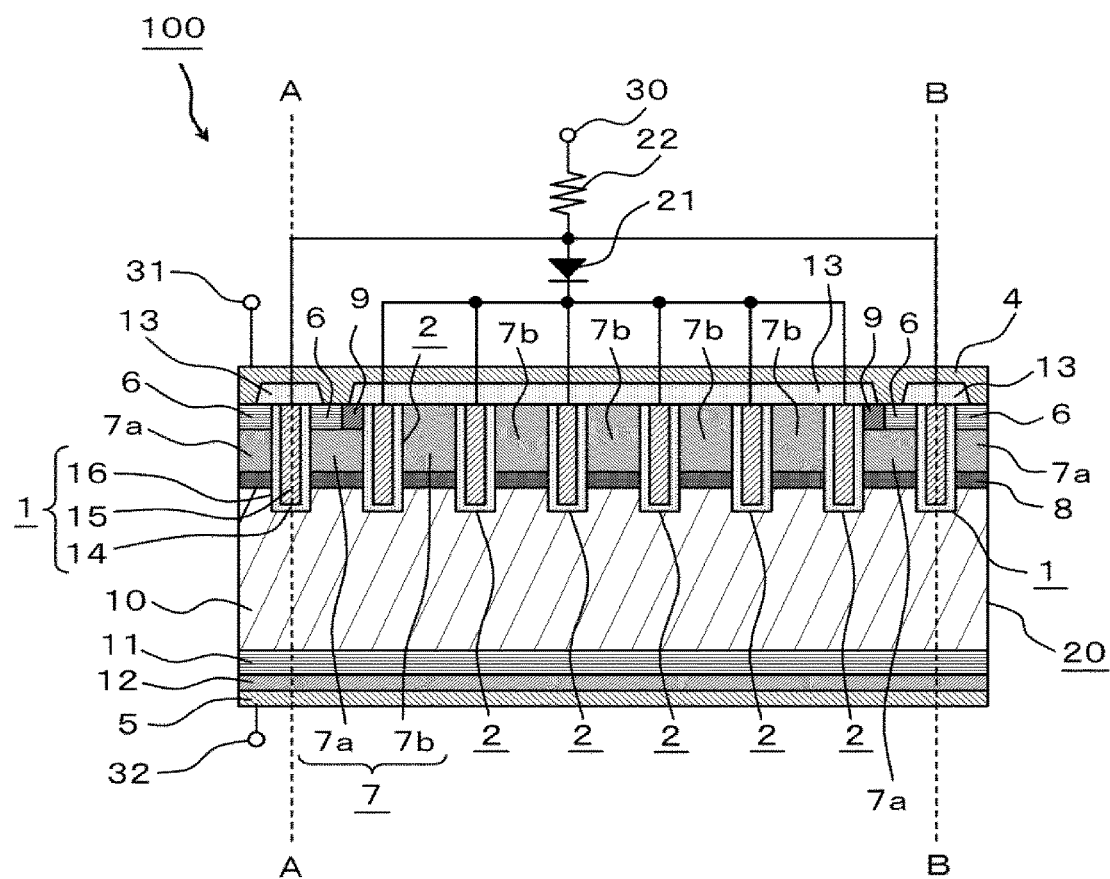
FIG. 3 is an enlarged cross-sectional structure view illustrating an IGBT element constituting the semiconductor apparatus according to the first embodiment of the present invention.

FIG. 3 is an enlarged cross-sectional structure view illustrating the IGBT element constituting the semiconductor apparatus according to the first embodiment of the present invention. FIG. 3 mainly shows in detail the structure of the IGBT element 20 of the semiconductor apparatus 100 illustrated in FIG. 1 and shows the diode 21 and the gate resistor 22 by circuit symbols in a simplified manner. FIG. 3 is a cross-sectional view of the IGBT element 20, particularly in an active region of the IGBT element, which is orthogonal to the longitudinal lines of trench gate. A range sandwiched between the dashed lines A-A and B-B in FIG. 3 represents a unit IGBT and the IGBT element 20 is configured to include a plurality of unit IGBTs arranged and formed horizontally along the paper surface.

In FIG. 3, the IGBT element 20 includes a p-type base layer 7 and an n-type carrier accumulation layer 8 that are formed on a top surface side of an n⁻-type drift layer 10 formed of an n⁻-type semiconductor substrate, and a plurality of trenches 16 formed through the p-type base layer 7 and the n-type carrier accumulation layer 8. The n-type carrier accumulation layer 8 is not necessarily needed, and the IGBT element may have a configuration of including no n-type carrier accumulation layer 8. A gate insulating film 14 is formed on an inner wall of each of the trenches 16, and a trench gate electrode 15 that is made of polysilicon containing an n-type impurity or a p-type impurity is embedded in each of the trenches 16 with the gate insulating film 14 interposed between the trench and the trench gate electrode to constitute a trench gate. That is, the trench gate is provided from a surface layer of the n⁻-type semiconductor substrate through to an inside of the n⁻-type semiconductor substrate. In the present invention, the surface layer refers to a region located on a surface of the n⁻-type semiconductor substrate on a side of which the p-type base layer 7 is formed. As illustrated in FIG. 3, the trench gates are classified into a first control electrode 1 as an active trench gate and a second control electrode 2 as an active dummy trench gate.

In the present invention, a dummy trench gate refers to a trench gate that does not function as a gate because a channel is not formed on a side surface of the gate, and a particular dummy trench gate, i.e., the active dummy trench gate refers to a dummy trench gate to which a gate voltage is applied from a gate driving circuit in the same manner as in the active trench gate. On the other hand, a trench gate on a side surface of which a channel is formed and which functions as a gate is simply referred to as a trench gate in some cases but referred to as an active trench gate when being clearly distinguished from the dummy trench gate and active dummy trench gate because the gate voltage is applied from the gate driving circuit.

Further, when the trench gate electrode 15 needs to be particularly distinguished between the active trench gate and the dummy trench gate, the trench gate electrode 15 of the active trench gate is referred to as an active trench gate electrode and the trench gate electrode 15 of the dummy trench gate is referred to as a dummy trench gate electrode. Furthermore, the trench gate electrode 15 of the active dummy trench gate to which the gate voltage is applied is referred to as an active dummy trench gate electrode when needing to be distinguished.

In a partial region of a surface layer portion of the p-type base layer 7 that is in contact with the first control electrode 1, an n⁺-type emitter layer 6 and a p⁺-type contact layer 9 are formed, and the n⁺-type emitter layer 6 is formed in contact with a side surface of the trench 16 for the active trench gate. That is, a trench gate having the trench 16 one or both side surfaces of which are in contact with the n⁺-emitter layer 6 is the active trench gate, and the active trench gate is the first control electrode 1 in the first embodiment. On the other hand, no n⁺-type emitter layer 6 is formed on a side surface of the trench 16 for the active dummy trench gate. That is, a trench gate having no trench 16 in contact with the n⁺-emitter layer 6 is the active dummy trench gate, and the active dummy trench gate is the second control electrode 2 in the first embodiment. Further, the p-type base layers 7 are classified into a first p-type base layer 7a that is in contact with the first control electrode 1 as the active trench gate and a second p-type base layer 7b that is not in contact with the first control electrode 1 and is surrounded by the second control electrodes 2 as the active dummy trench gates.

The p⁺-type contact layer is provided in contact with the n⁺-type emitter layer 6. The emitter electrode 4 is provided on partial surfaces of the p-type contact layer 9 and the n⁺-type emitter layer 6 and is in contact with the p⁺-type contact layer 9 and the n⁺-type emitter layer 6. An interlayer insulating film 13 is formed on the other partial surfaces of the p⁺-type contact layer 9 and the n⁺-type emitter layer 6 to insulate the p⁺-type contact layer 9 and the n⁺-type emitter layer 6 from the emitter electrode 4. The interlayer insulating film 13 is also formed on the trench gates as the first control electrode 1 and the second control electrode 2 as well as the second p-type base layer 7b to insulate them from the emitter electrode 4.

An n-type buffer layer 11 and a p-type collector layer 12 are formed on a bottom surface side of the n⁻-type drift layer 10 formed of the n⁻-type semiconductor substrate. Further, the collector electrode 5 is formed on the p-type collector layer 12.

The first control electrode 1 is connected to a first gate pad (not shown) provided on a surface of the IGBT element 20 and the second control electrode 2 is connected to a second gate pad (not shown) provided on a surface of the IGBT element 20, to constitute the IGBT element 20.

The diode 21 is connected between the first gate pad and the second gate pad with an anode and a cathode of the diode corresponding to the first gate pad and the second gate pad, respectively. That is, as illustrated in FIG. 3, the anode and the cathode of the diode 21 are connected to the first control electrode 1 and the second control electrode 2, respectively. Further, the first gate pad is connected to one end of the gate resistor 22. The other end of the gate resistor 22 is connected to the gate terminal 30 provided on the case 28 of the semiconductor apparatus 100. When the semiconductor apparatus 100 has a configuration including no gate resistor 22, the first gate pad is connected to the gate terminal 30.

The emitter electrode 4 is connected to the emitter terminal 31 provided on the case 28 of the semiconductor apparatus 100, and the collector electrode 5 is connected to the collector terminal 32 provided on the case 28 of the semiconductor apparatus 100.

The semiconductor apparatus 100 is configured as described above.

Next described is operation of the semiconductor apparatus 100.

A main voltage Vce is applied between the emitter terminal 31 and the collector terminal 32 of the semiconductor apparatus 100 in such a manner that the collector terminal 32 has a higher voltage. When a positive voltage is applied to the gate terminal 30 of the semiconductor apparatus 100 from the gate driving circuit provided outside the semiconductor apparatus 100, an inversion layer is formed in the first p-type base layer 7a in contact with a side surface of the trench 16 for the first control electrode 1, to open a channel. Then, electrons are injected from the n⁺-type emitter layer 6 to the n⁻-type drift layer 10, passing the n-type buffer layer 11 to reach the p-type collector layer 12. In this process, holes (positive holes) are injected from the p-type collector layer 12 to the n⁻-type drift layer 10 to satisfy charge neutralized conditions. A part of the holes injected from the p-type collector layer 12 passes from the first p-type base layer 7a through the p-type contact layer 9 to the emitter electrode 4, from which the part of the holes flows out of the IGBT element 20.

On the other hand, another part of the holes that does not flow from the emitter electrode 4 out of the IGBT element 20 reaches the second p-type base layer 7b and is accumulated in the second p-type base layer 7b. A part of the holes accumulated in the second p-type base layer flows into the first p-type base layer 7a as a hole current. This increases carrier density in a channel portion of the first p-type base layer 7a to enhance a conductivity modulation effect, reducing a conduction loss of the IGBT element 20.

The holes accumulated in the second p-type base layer 7b, however, transiently raise an electric potential of the second p-type base layer 7b at the time of turn-on of the IGBT element 20. The second p-type base layer 7b and the trench gate electrode 15 of the second control electrode 2 form electrostatic capacitance because the trench 16 of the second control electrode 2 has the gate-insulating film 14 formed on the inner wall thereof. Therefore, a displacement current caused by the rise in electric potential of the second p-type base layer 7b attempts to flow into the first control electrode 1 via the second control electrode 2. The diode 21, however, is connected between the second control electrode 2 and the first control electrode 1 with the cathode of the diode corresponding to the second control electrode 2, so that the displacement current that attempts to flow into the first control electrode 1 via the second control electrode 2 is prevented by the diode 21 and cannot flow into the first control electrode 1. This makes the current that flows into the first control electrode 1 only a current supplied through the gate terminal 30 from the external gate driving circuit, so that it is possible to control turn-on time of the IGBT element 20 by a resistance value of the gate resistor 22, increasing the controllability. That is, it is possible to increase the controllability of the rate of change in collector voltage with respect to time (dV/dt) in the IGBT element 20 at the time of turn-on of the IGBT element.

Next, an action effect of the semiconductor apparatus 100 according to the present invention is further described in detail by comparing the semiconductor apparatus according to the present invention with a conventional semiconductor apparatus having no diode 21 connected between the first control electrode 1 and the second control electrode 2.

FIG. 4 is an enlarged cross-sectional structure view illustrating an IGBT element constituting the conventional semiconductor apparatus. A semiconductor apparatus 200 in FIG. 4 has a configuration of removing the diode 21 from the semiconductor apparatus 100 illustrated in FIG. 3, connecting the first control electrode 1 to the second control electrode 2, and connecting the gate resistor 22 to this connection between the first control electrode and the second control electrode. The semiconductor apparatus 200 is identical with the semiconductor apparatus 100 in FIG. 3 except for removing the diode 21.

Figure 5A:
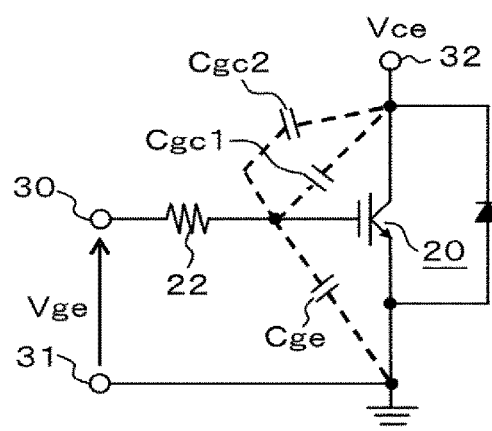
FIGS. 5A to 5D are circuit diagrams illustrating equivalent circuits of the conventional semiconductor apparatus and the semiconductor apparatus according to the first embodiment of the present invention.
Figure 5B:
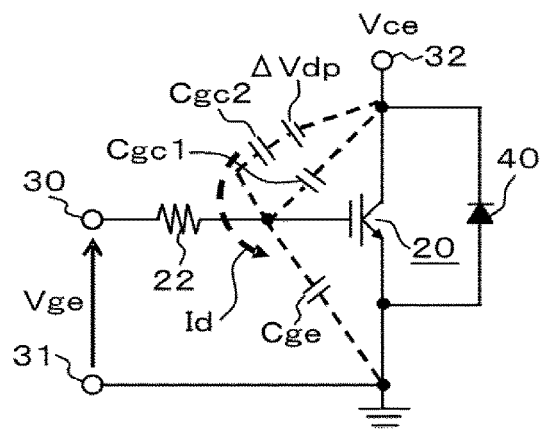
Figure 5C:
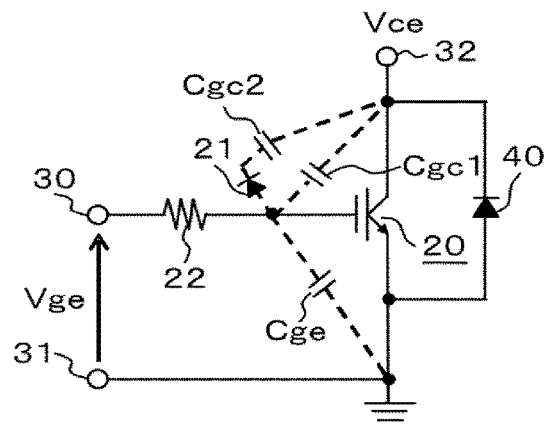
Figure 5D:
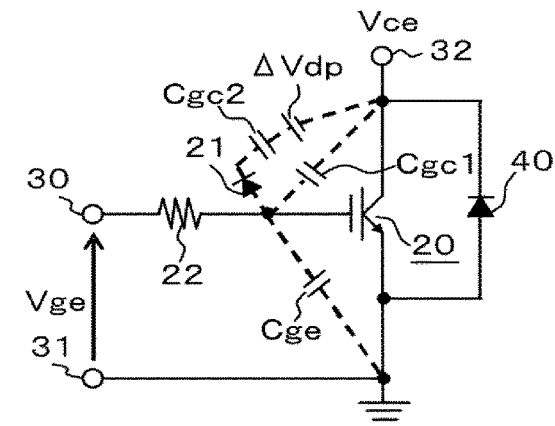

FIGS. 5A to 5D are circuit diagrams illustrating equivalent circuits of the conventional semiconductor apparatus and the semiconductor apparatus according to the first embodiment of the present invention. FIGS. 5A to 5D each show a lower arm in a half bridge circuit. FIG. 5A shows an equivalent circuit configured to have the conventional semiconductor apparatus 200 as the lower arm in the half bridge circuit, and FIG. 5C shows an equivalent circuit configured to have the semiconductor apparatus 100 according to the present invention as the lower arm in the half bridge circuit. Further, FIG. 5B is a circuit diagram illustrating generation of the rise in electric potential in the second p-type base layer 7b at the time of turn-on of the conventional semiconductor apparatus 200, and FIG. 5D is a circuit diagram illustrating generation of the rise in electric potential in the second p-type base layer 7b at the time of turn-on of the semiconductor apparatus 100 according to the present invention.

In FIGS. 5A to 5D, the IGBT element 20 is connected to a free wheeling diode 40 in parallel, and an anode and a cathode of the free wheel diode 40 are connected to the emitter terminal 31 and the collector terminal 32, respectively. The main voltage Vce is applied between the emitter terminal 31 and the collector terminal 32 of the semiconductor apparatus 100 in such a manner that the collector terminal 32 has a higher electric potential. A gate voltage Vge is applied between the emitter terminal 31 and the gate terminal 30 from the gate driving circuit outside the semiconductor apparatuses 200 and 100 in such a manner that the gate terminal 30 has a higher electric potential. The gate voltage Vge is applied between the emitter and the gate of the IGBT element 20 via the gate resistor 22.

In FIGS. 5A to 5D, a parasitic capacitance component of the IGBT element 20 is illustrated by a dashed line. Cgc1 represents electrostatic capacitance between the first control electrode 1 and the collector electrode 5. Cgc2 represents electrostatic capacitance between the second control electrode 2 and the collector electrode 5. Cge represents electrostatic capacitance between the first control electrode 1 and the emitter electrode 4. A sign ΔVdp illustrated in FIGS. 5B and 5D represent the rise in electric potential that is generated by accumulation of holes in the second p-type base layer 7b at the time of turn-on of the IGBT element 20.

First described is the conventional semiconductor apparatus 200 in FIG. 5A. When the gate voltage Vge is applied from the gate driving circuit outside the semiconductor apparatus 200, holes, among holes injected from the p-type collector layer 12 in FIG. 4, which have not been discharged from the emitter electrode 4 out of the IGBT element 20 are accumulated in the second p-type base layer 7b to generate the rise in electric potential ΔVdp, in the same manner as in the semiconductor apparatus 100 according to the present invention that is illustrated in FIG. 3. As illustrated in FIG. 5B, the ΔVdp is equivalent to a direct-current power source connected between the parasitic capacitance Cgc2 and the collector electrode 5 of the IGBT element 20 in such a manner that the collector electrode 5 has a lower electric potential.

As illustrated in FIG. 5B, when the rise in electric potential ΔVdp is generated at the time of turn-on of the IGBT element 20, a displacement current Id that charges the parasitic capacitance Cgc2 flows from the collector of the IGBT element 20. The displacement current Id passes the parasitic capacitance Cgc2 and gate wiring, charges the parasitic capacitance Cge, and flows out from the emitter of the IGBT element 20.

An increase in amount of a current that flows into the parasitic capacitance Cge due to the displacement current Id fast opens the channel of the first p-type base layer 7a in contact with the first control electrode 1 to accelerate the turn-on of the IGBT element 20. The displacement current Id flows into the parasitic capacitance Cge without passing the gate resistor 22, so that it becomes difficult to control the turn-on time of the IGBT element 20 by adjusting the resistance value of the gate resistor 22. That is, the holes accumulated in the second p-type base layer 7b charges the parasitic capacitance Cge between the gate and the emitter of the IGBT element 20 to flow the displacement current Id that accelerates the turn-on, causing a problem of decreasing the controllability of the rate of change in collector voltage with respect to time (dV/dt) by the gate resistor 22 in the IGBT element 20. An excessively large dV/dt causes noise and a surge, so that the dV/dt needs to be appropriately controlled by the gate resistor 22.

Figure 6A:
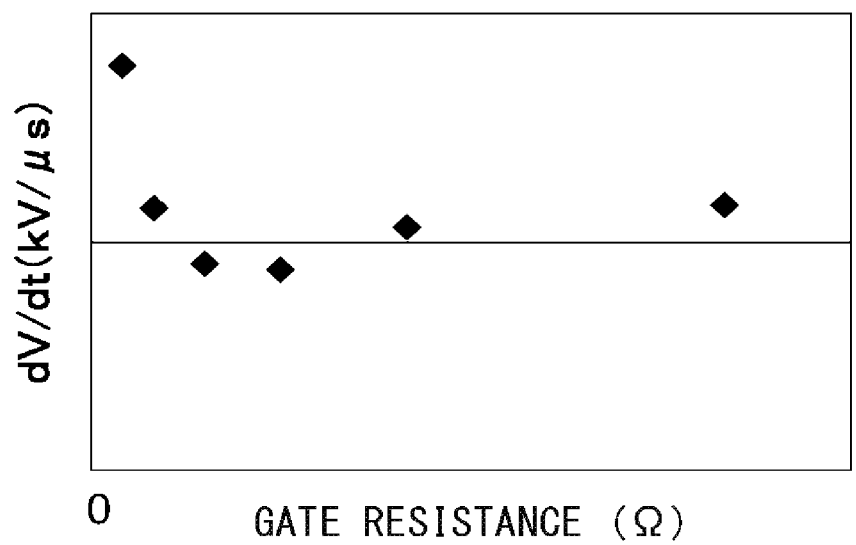
FIGS. 6A and 6B are diagrams illustrating, in the IGBT element constituting the conventional semiconductor apparatus, a relationship between the gate resistance and the dV/dt, and a result of measuring a waveform of a voltage between the gate and the emitter at the time of turn-on of the IGBT element.
Figure 6B:
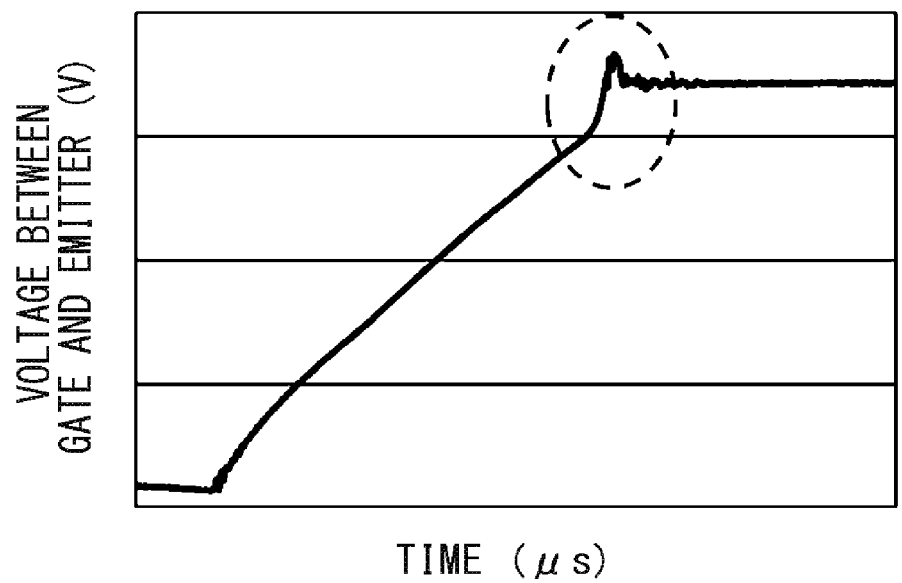

FIGS. 6A and 6B are diagrams illustrating, in the IGBT element constituting the conventional semiconductor apparatus, a relationship between the gate resistance and the dV/dt, and a result of measuring a waveform of a voltage between the gate and the emitter at the time of turn-on of the IGBT element. FIG. 6A shows a measurement result of the dV/dt when the gate resistance value of the IGBT element as the conventional semiconductor apparatus is increased from 0Ω, and FIG. 6B shows a result of measuring a waveform of a voltage between the gate and the emitter at the time of turn-on of the IGBT element, at a gate resistance value larger than a gate resistance value at which the dV/dt illustrated in FIG. 6A shows a minimum value, that is, at a gate resistance value at which the dV/dt starts to increase from the minimum value.

As illustrated in FIG. 6A, the dV/dt decreases as the resistance value of the gate resistor 22 increases from 0Ω. The dV/dt, however, gives a minimum value at a certain gate resistance value and then increases as the gate resistance value increases. As described above, the conventional semiconductor apparatus 200 has given a result that it is impossible to sufficiently control the dV/dt even adjusting the resistance value of the gate resistor 22. As illustrated in FIG. 6B, the voltage between the gate and the emitter gradually increases along with the charge of the parasitic capacitance between the gate and the emitter from the start of the turn-on. However, at a gate resistance value of the gate resistor 22 from which the dV/dt does not decrease even with an increased gate resistance value, a sudden rise in the voltage between the gate and the emitter has been confirmed to be generated as illustrated by a region surrounded by a dashed line in FIG. 6B. This phenomenon is generated due to the charge of the parasitic capacitance Cge by the displacement current Id as described above, and this steep change in the voltage between the gate and the emitter is considered to generate a large dV/dt. That is, it is impossible to prevent the charge of the parasitic capacitance Cge by the displacement current Id in the conventional semiconductor apparatus 200, causing the problem of decreasing the controllability of the dV/dt by the gate resistor 22.

Further, in the conventional semiconductor apparatus 200, holes left in the second p-type base layer 7b at the time of turn-off of the IGBT element 20 sometimes flow as the displacement current Id into the parasitic capacitance Cge, in the same manner as the time of turn-on of the IGBT element, possibly generating false turn-on at the time of turn-off of the IGBT element 20.

On the other hand, in the semiconductor apparatus 100 according to the present invention, the diode 21 is, as illustrated in FIG. 3, connected between the second control electrode 2 and the first control electrode 1 with the anode and the cathode of the diode corresponding to the first control electrode 1 and the second control electrode 2, respectively, which is represented by the equivalent circuit in FIG. 5C. Even when holes are accumulated in the second p-type base layer 7b at the time of turn-on of the IGBT element 20 to generate the rise in electric potential ΔVdp in the second p-type base layer 7b, such a configuration allows the diode 21 to prevent the displacement current that attempts to occur due to the ΔVdp, so that the displacement current does not flow. Thus, the displacement current that charges the parasitic capacitance Cge does not flow as illustrated in FIG. 5D, enabling the charging current of the parasitic capacitance Cge to be controlled by the gate resistor 22. That is, the dV/dt at the time of turn-on of the IGBT element 20 can be controlled by the gate resistor 22. This enables a producer or a user of the semiconductor apparatus 100 to set the dV/dt of the IGBT element 20 to any value by the gate resistor 22 incorporated in the semiconductor apparatus 100 or by an external gate resistor connected to the gate terminal 30 of the semiconductor apparatus 100, improving usability of the semiconductor apparatus 100.

In addition, the holes accumulated in the second p-type base layer 7b become unlikely to be discharged from the second p-type base layer 7b increasing a hole that flows, as a hole current, from the second p-type base layer 7b into the first p-type base laser 7a to enhance the conductivity modulation effect, decreasing the conduction loss of the IGBT element 20. Further, the displacement current is also prevented at the time of turn-off of the IGBT element 20, so that the Cge is not charged by the displacement current suppressing the generation of false turn-on.

To be exact, when a reverse voltage ΔVdp is applied to the diode 21, the diode has parasitic capacitance between the anode electrode and the cathode electrode. As understood from comparison between FIGS. 5A and 5C, however, even when the parasitic capacitance of the diode 21 is taken into consideration, the electrostatic capacitance of the IGBT element 20 in a route including the parasitic capacitance Cgc2 is smaller in FIG. 5C, to decrease the displacement current Id that flows due to the rise in electric potential ΔVdp in the second p-type base layer 7b. Particularly, using as the diode 21 a compact diode small in parasitic capacitance can substantially make the parasitic capacitance of the diode 21 negligible.

Figure 7:
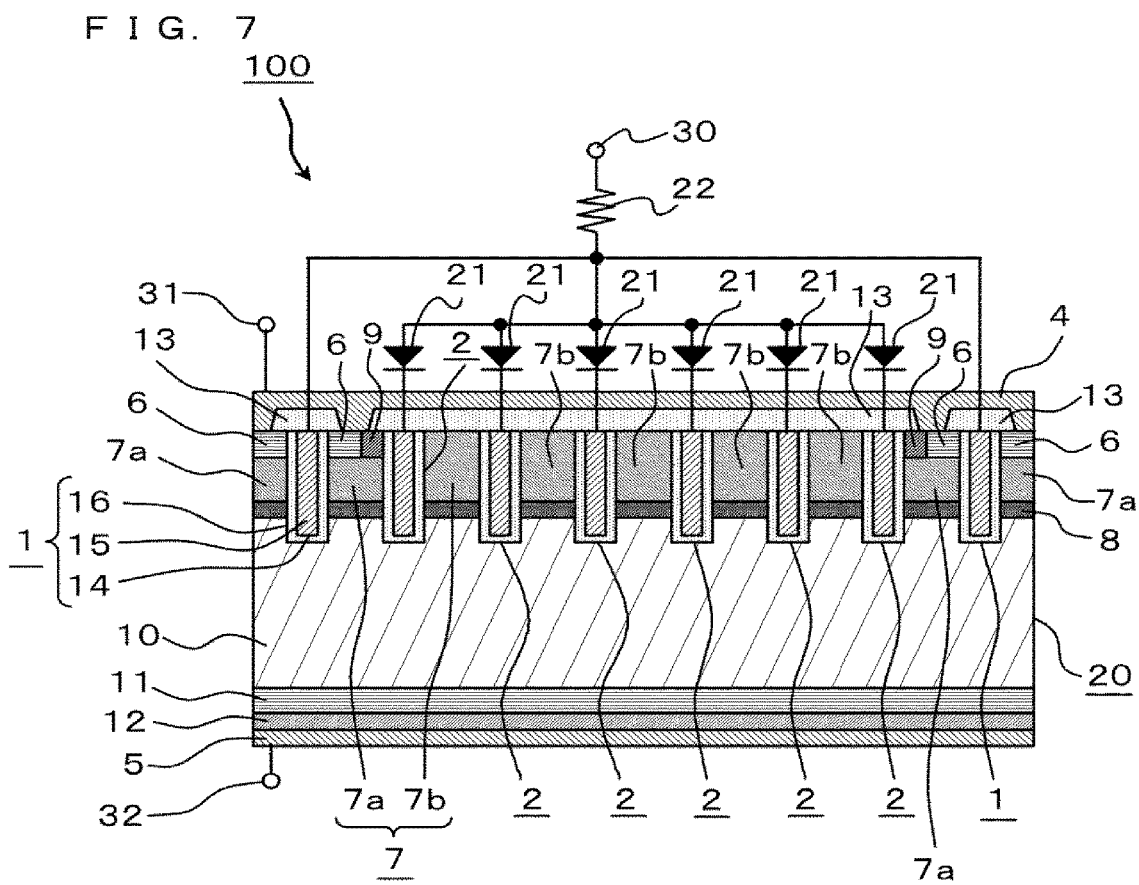
FIG. 7 is an enlarged cross-sectional structure view illustrating an IGBT element that constitutes a semiconductor apparatus having another configuration according to the first embodiment of the present invention.

FIG. 7 is an enlarged cross-sectional structure view illustrating an IGBT element that constitutes a semiconductor apparatus having another configuration according to the first embodiment of the present invention. In the semiconductor apparatus illustrated in FIG. 3, a plurality of second control electrodes 2 are connected, and the cathode of the diode 21 is connected to this connection of the second control electrodes. In a semiconductor apparatus 100 illustrated in FIG. 7, however, second control electrodes 2 are connected to cathodes of diodes 21, respectively, and a first control electrode 1 is connected to connection formed by connecting anodes of the diodes 21.

The semiconductor apparatus 100 illustrated in FIG. 7 also has the equivalent circuits illustrated in FIGS. 5C and 5D, giving the same action effect as that of the semiconductor apparatus according to the present invention that is illustrated in FIG. 3. As illustrated in FIG. 7, a configuration of providing the diodes 21 for the second control electrodes 2, respectively, is appropriate for, for example, a semiconductor apparatus 100 having a configuration of forming the diodes 21 in the IGBT element 20 by a semiconductor process.

As described above, in the semiconductor apparatus 100 according to the first embodiment, the diode 21 is provided between the second control electrode 2 and the first control electrode 1 with the anode and the cathode of the diode corresponding to the first control electrode 1 and the second control electrode 2, respectively. This configuration prevents the displacement current Id caused by the rise in electric potential ΔVdp in the second p-type base layer 7b from flowing into the Cge, to give an effect of preventing the generation of false turn-on at the time of turn-off of the IGBT element 20 while increasing the controllability of the dV/dt at the time of turn-on of the IGBT element 20. Further, this configuration gives an effect of increasing a hole that flows into the first p-type base layer 7a to decrease the conduction loss of the IGBT element 20. These effects can give a semiconductor apparatus excellent in energy saving, high in usability, and high in reliability.

Second Embodiment

Figure 8:
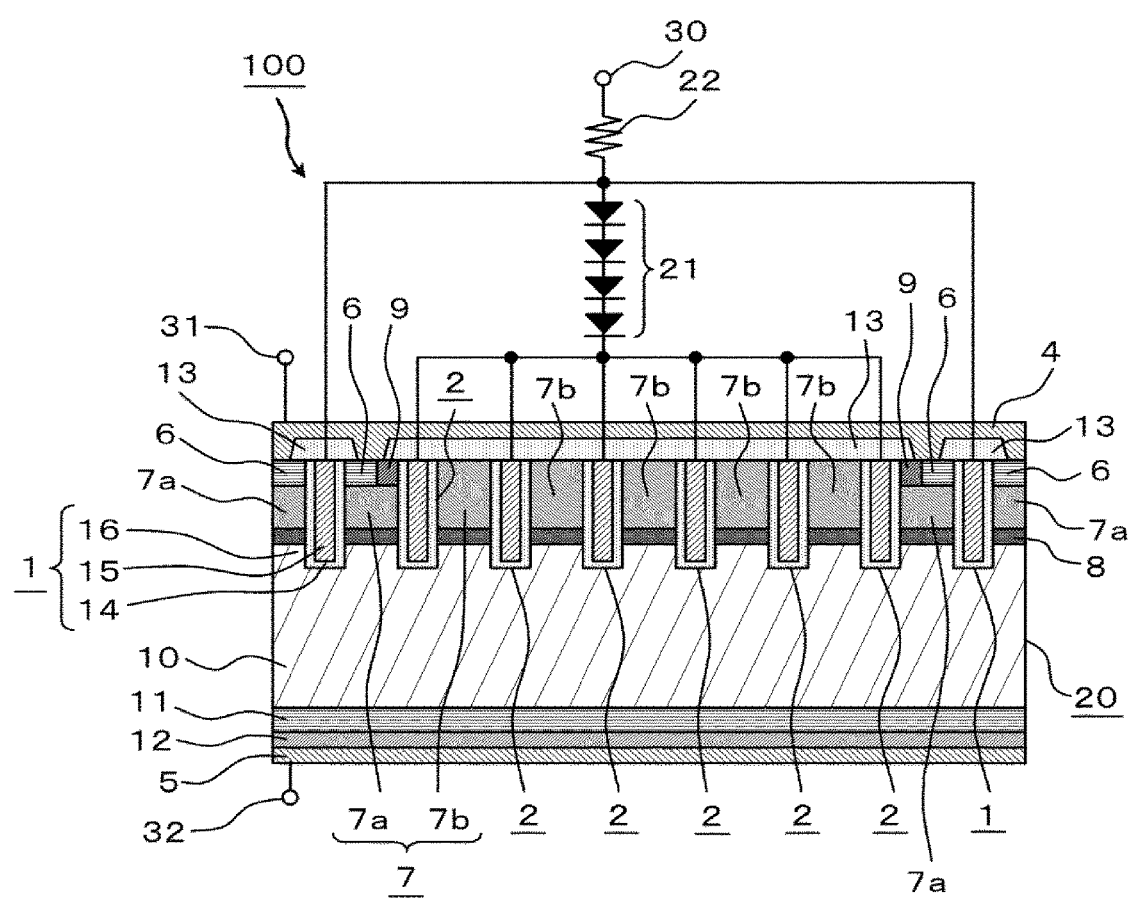
FIG. 8 is an enlarged structure cross section illustrating an IGBT element constituting a semiconductor apparatus according to a second embodiment of the present invention.

FIG. 8 is an enlarged structure cross section illustrating an IGBT element constituting a semiconductor apparatus according to a second embodiment of the present invention. In FIG. 8, a component having the same reference sign as the reference sign of a component in FIG. 1 has the identical configuration with or a configuration corresponding to the configuration of the component in FIG. 1, and the description for the component is omitted. The second embodiment is different from the first embodiment according to the present invention in that the semiconductor apparatus has a configuration of connecting a plurality of diodes in series. In the second embodiment according to the present invention, described is a part different from that in the first embodiment according to the present invention, and description is omitted for the identical part or a corresponding part.

In FIG. 8, a diode 21 is configured to include a plurality of diodes unidirectionally connected in series. That is, an anode of one diode is connected to a cathode of another diode whose anode is further connected to a cathode of still another diode. Accordingly, the diode 21 configured to include the plurality of diodes connected in series has an anode on one end and a cathode on the other end.

A plurality of second control electrodes 2 are connected and the cathode of the diode 21 including the plurality of diodes connected in series is connected to this connection of the second control electrodes. Further, the anode of the diode 21 including the plurality of diodes connected in series is connected to a first control electrode 1.

Also in s semiconductor apparatus 100 illustrated in FIG. 8, even when the rise in electric potential ΔVdp is generated by the holes accumulated in a second p-type base layer 7b, the diode 21 including the plurality of diodes connected in series can prevent the displacement current that charges the parasitic capacitance Cge to increase the controllability of the dV/dt of the IGBT element 20, as described in the first embodiment.

Further, the diode 21 can be configured to include the plurality of diodes connected in series to decrease integrated parasitic capacitance of the whole diode 21 that consists of the parasitic capacitance of the diodes, so that it is possible to further suppress the displacement current Id that attempts to flow using the parasitic capacitance of a diode.

Figure 9:
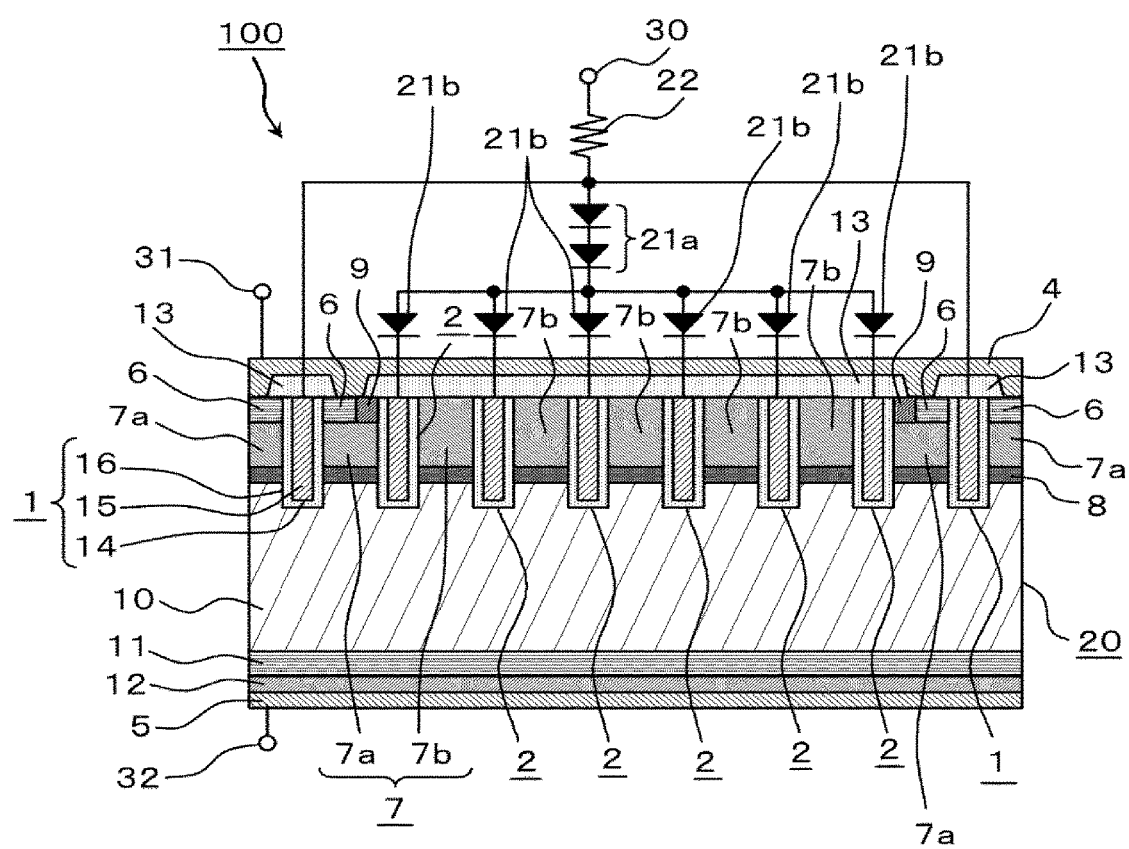
FIG. 9 is an enlarged structure cross section illustrating an IGBT element that constitutes a semiconductor apparatus having another configuration according to the second embodiment of the present invention.

FIG. 9 is an enlarged structure cross section illustrating an IGBT element that constitutes a semiconductor apparatus having another configuration according to the second embodiment of the present invention. In FIG. 9, a component having the same reference sign as the reference sign of a component in FIG. 8 has the identical configuration with or a configuration corresponding to the configuration of the component in FIG. 8, and the description for the component is omitted. The semiconductor apparatus in FIG. 9 is different from the semiconductor apparatus in FIG. 8 in that it has a configuration of including a diode 21a that is configured to have a plurality of diodes connected in series and also including diodes 21b connected to second control electrodes 2, respectively.

In FIG. 9, the second control electrodes 2 of a semiconductor apparatus 100 are connected to cathodes of the diodes 21b, respectively, and a cathode of the diode 21a configured to include the plurality of diodes connected in series is connected to connection formed by connecting anodes of the plurality of diodes 21b. A first control electrode 1 is connected to an anode of the diode 21a configured to include the plurality of diodes connected in series.

Also in the semiconductor apparatus 100 illustrated in FIG. 9, even when the rise in electric potential ΔVdp is generated by the holes accumulated in a second p-type base laser 7b, the diode 21a including the plurality of diodes connected in series, and the diodes 21b connected to the second control electrodes 2, respectively, can prevent the displacement current that charges the parasite capacitance Cge to increase the controllability of the dV/dt of the IGBT element 20, as described in the first embodiment.

Further, in the same manner as in the semiconductor apparatus illustrated in FIG. 8, the diode 21a can be configured to include the plurality of diodes connected in series to decrease integrated parasitic capacitance of the diode 21a. Furthermore, the diode 21a can be connected in series to the diodes 21b connected to the second control electrodes, respectively, to further decease integrated parasitic capacitance of the diode 21a and the diodes 21b. This can further suppress the displacement current Id that attempts to flow using the parasitic capacitance of a diode.

In the semiconductor apparatuses 100 according to the second embodiment, a way of connecting the plurality of diodes between the first control electrode 1 and the second control electrodes 2 is not limited to the configurations illustrated in FIGS. 8 and 9. For example, the diode 21 is configured to include four diodes connected in series in FIG. 8; the number of diodes, however, may be larger or smaller as long as the diode 21 includes at least two diodes. In the same manner, the diode 21a is configured to include two diodes connected in series in FIG. 9; the number of diodes, however, may be larger. Further, the diodes 21b respectively connected to the second control electrodes 2 in FIG. 9 may be a diode configured to include a plurality of diodes connected in series.

As described above, according to the semiconductor apparatuses according to the second embodiment, the plurality of diodes can be connected in series between the first control electrode 1 and the second control electrodes 2, to increase capability of preventing the displacement current generated by the rise in electric potential in the second p-type base layer 7b, giving an effect of further increasing the controllability of the dV/dt of the IGBT element 20.

Third Embodiment

Figure 10:
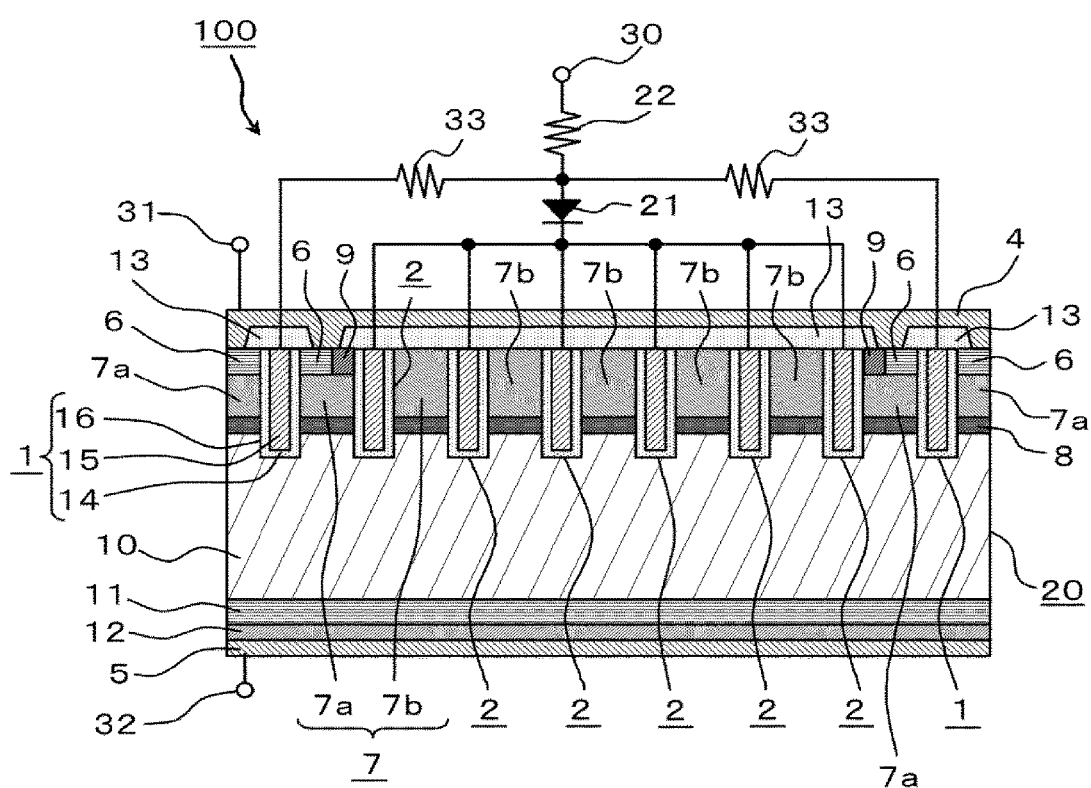
FIG. 10 is an enlarged structure cross-sectional view illustrating an IGBT element constituting a semiconductor apparatus according to a third embodiment of the present invention.
Figure 11:
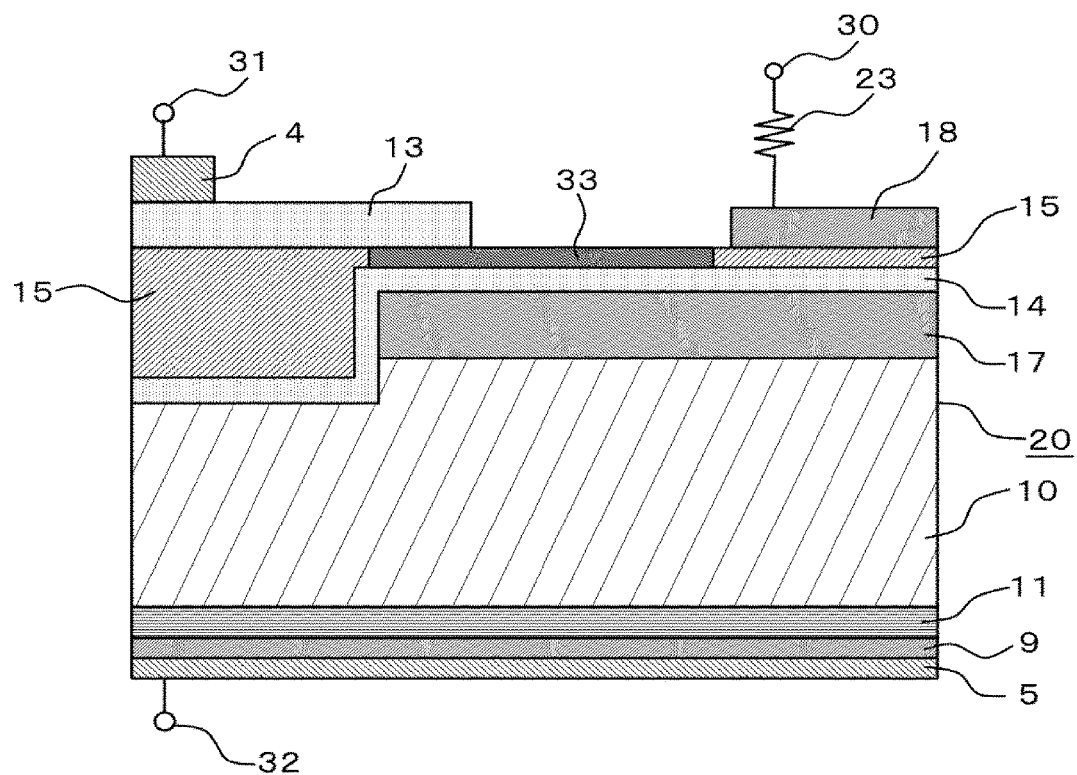
FIG. 11 is an enlarged structure cross-sectional view illustrating an element peripheral portion of the IGBT element constituting the semiconductor apparatus according to the third embodiment of the present invention.

FIG. 10 is an enlarged structure cross-sectional view illustrating an IGBT element constituting a semiconductor apparatus according to a third embodiment of the present invention. FIG. 11 is an enlarged structure cross-sectional view illustrating an element peripheral portion of the IGBT element constituting the semiconductor apparatus according to the third embodiment of the present invention. In FIGS. 10 and 11, a component having the same reference sign as the reference sign of a component in FIG. 3 has the identical configuration with or a configuration corresponding to the configuration of the component in FIG. 3, and the description for the component is omitted. The third embodiment is different from the first embodiment according to the present invention in that the semiconductor apparatus has a configuration of providing a built-in gate resistor 33 between a first control electrode 1 and an anode of a diode 21. FIG. 11 is a cross-sectional view along the first control electrode 1.

In FIG. 10, the built-in gate resistor 33 is formed in the element peripheral portion of a trench gate electrode 15 of an active trench gate that constitutes the first control electrode 1. Specifically, the built-in gate resistor 33 is prepared between the trench gate electrode 15 formed in an active region of the IGBT element and a first gate pad to be connected to the first control electrode 1 by forming a region having a lower impurity concentration of the trench gate electrode 15 than that in the active region.

As illustrate in FIG. 11, the trench gate electrode 15 constituting the first control electrode 1 of the IGBT element 20 is pulled up to an element upper portion in the element peripheral portion to form a gate wiring portion, and the gate wiring portion of the trench gate electrode 15 is connected to a first gate pad 18. In a part of the gate wiring portion of the trench gate electrode 15, a region is formed that has a lower concentration of an n-type or p-type impurity contained in polysilicon than that in the active region, and this lower impurity concentration region constitutes the built-in gate resistor 33. In FIG. 11, a p-type well layer 17 is formed under the gate wiring portion of the trench gate electrode 15 and the built-in gate resistor 33 in the element peripheral portion to perform a terminating function of the IGBT element 20. Thus, the p-type well layer 17 terminates a depletion layer extending from the active region to the element peripheral portion.

The resistance value of the built-in gate resistor 33 can be set to any value by adjusting the concentration of an impurity contained in polysilicon in the trench gate electrode 15. Alternatively, the resistance value can be set to any value by adjusting the length of the region for forming the built-in gate resistor 33. The resistance value of the built in gate resistor 33 is adjusted so as to be equivalent to a resistance component caused by a forward voltage drop of the diode 21.

In the semiconductor apparatus according to the first embodiment that is illustrated in FIG. 3, the second control electrode 2 is connected to the cathode of the diode 21, the anode of the diode 21 is connected to the first control electrode 1, one end of the gate resistor 23 is connected to this connection between the diode 21 and the first control electrode 1, and the other end of the gate resistor 22 is connected to the gate terminal 30. Therefore, between the gate terminal 30 and the second control electrodes 2 are applied the resistance components attributed to the gate resistor 22 as well as the forward voltage drop of the diode 21. On the other hand, only the gate resistor 22 is connected between the gate terminal 30 and the first control electrode 1, so that charging and discharging speed of the gate voltage applied to the gate terminal is different between the first control electrode 1 and the second control electrode 2. This causes concentration of an electric field in one or some of the trenches 16 at a bottom of the gate insulating film 14 formed on the inner wall of the trench(es) to possibly decrease the reliability in dielectric strength of the gate insulating film 14.

On the other hand, in the semiconductor apparatus 100 according to the third embodiment, the built-in resistor 33 is prepared in such a manner that the resistance value of the built-in resistor 33 is adjusted to a value equivalent to the component caused by the forward voltage drop of the diode 21, to equalize the charging and discharging speed between the first control electrode 1 and the second control electrode 2 when the gate voltage is applied to the gate terminal 30, alleviating the concentration of an electric field in one or some of the trenches 16 at a bottom of the gate insulating film 14 formed on the inner wall of the trench(es). This can give an effect of increasing the reliability in dielectric strength of the gate insulating film 14.

Fourth Embodiment

Figure 12:
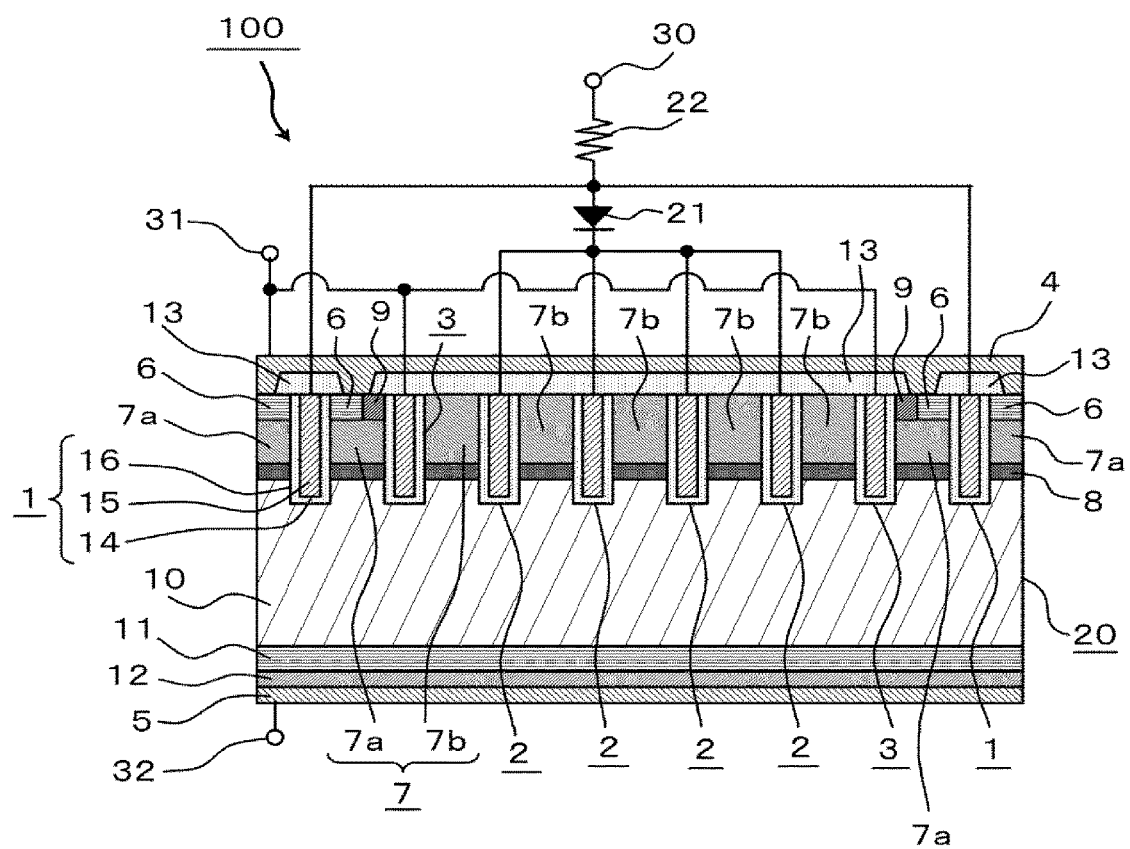
FIG. 12 is an enlarged structure cross-sectional view illustrating an IGBT element constituting a semiconductor apparatus according to a fourth embodiment of the present invention.

FIG. 12 is an enlarged structure cross-sectional view illustrating an IGBT element constituting a semiconductor apparatus according to a fourth embodiment of the present invention. In FIG. 12, a component having the same reference sign as the reference sign of a component in FIG. 3 has the identical configuration with or a configuration corresponding to the configuration of the component in FIG. 3, and the description for the component is omitted. The fourth embodiment is different from the first embodiment according to the present invention in that the semiconductor apparatus has a configuration of connecting one or some of dummy trench gates to an emitter terminal 31, not making the dummy trench gate(s) into active dummy trench gate(s).

In FIG. 12, a third control electrode 3 as the dummy trench gate that is next to a first control electrode 1 is connected to the emitter terminal 31. Therefore, the number of second control electrodes 2 as the active dummy trench gates that are connected to a cathode of a diode 21 is smaller than that in the semiconductor apparatus according to the first embodiment that is illustrated in FIG. 3.

A dummy trench gate connected to the emitter terminal 31 is referred to as the third control electrode 3, and the third control electrode 3 is not limited to the dummy trench gate next to the first control electrode 1, but may be any dummy trench gate. The number of the third control electrodes 3 connected to the emitter terminal 31 may be any number as long as at least one of the dummy trench gates is not connected to the emitter terminal 31 and is the second control electrode 2 as the active dummy trench gate to which the gate voltage is applied.

A semiconductor apparatus 100 according to the fourth embodiment can reduce the electrostatic capacitance between the gate and the collector and the electrostatic capacitance between the gate and the emitter in the IGBT element 20 by connecting the third control electrode 3 to the emitter terminal 31, so that switching speed can be increased to reduce a switching loss. Further, the number of control electrodes connected to the gate terminal 30 can be decreased to reduce a gate current necessary for charging and discharging the control electrodes. This can decrease output capacity of a gate driving circuit provided outside the semiconductor apparatus 100 to give an effect of downsizing the semiconductor apparatus 100 and devices having a peripheral circuit such as a gate driving circuit mounted therein.

Fifth Embodiment

Figure 13:
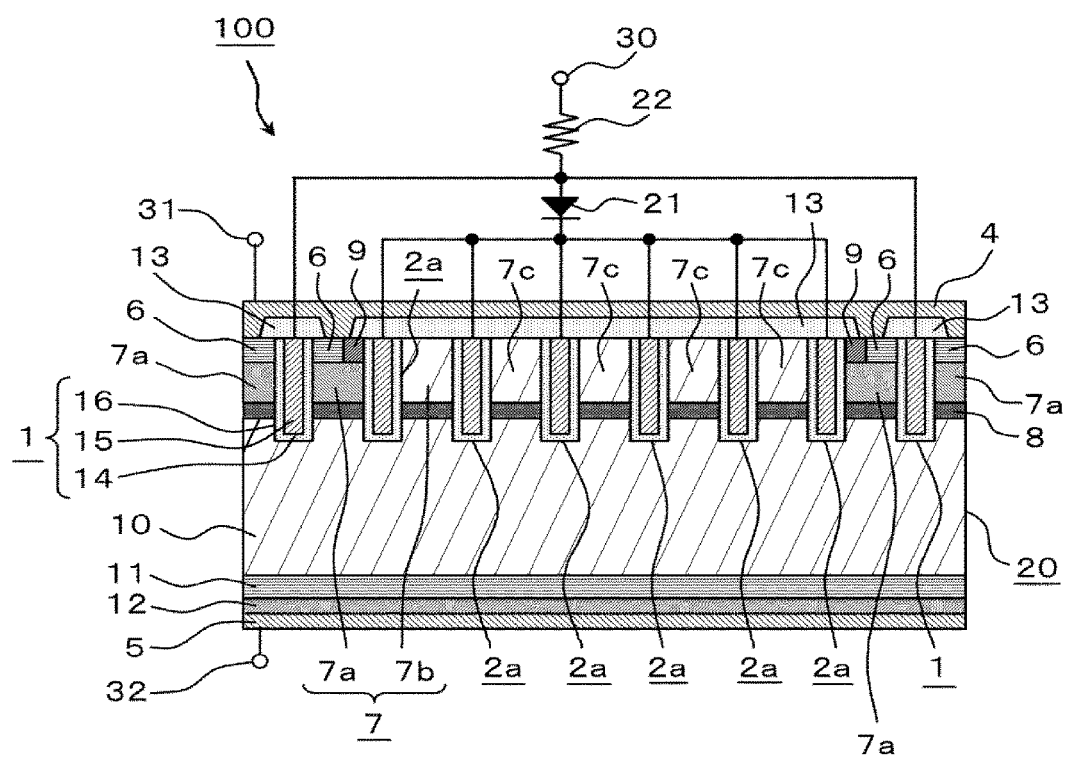
FIG. 13 is an enlarged structure cross-sectional view illustrating an IGBT element constituting a semiconductor apparatus according to a fifth embodiment of the present invention.

FIG. 13 is an enlarged structure cross-sectional view illustrating an IGBT element constituting a semiconductor apparatus according to a fifth embodiment of the present invention. In FIG. 13, a component having the same reference sign as the reference sign of a component in FIG. 3 has the identical configuration with or a configuration corresponding to the configuration of the component in FIG. 3, and the description for the component is omitted. The fifth embodiment is different from the first embodiment according to the present invention in that the semiconductor apparatus has a configuration of providing a second n-type base layer 7c in place of the second p-type base layer. A trench gate in contact with the second n-type base layer 7c is also a dummy trench gate and is referred to as an active dummy trench gate when the gate voltage is applied to the trench gate. A role of a second control electrode 2a as the active dummy trench gate is the same as that of the second control electrode 2 described in the first to fifth embodiments.

In FIG. 13, the second n⁻-type base layer is provided on a part of a top surface side of an n⁻-type drift layer 10 formed of an n⁻-type semiconductor substrate, and the second n⁻-type base layer 7c is in contact with the second control electrode 2a as the active dummy trench gate. That is, the region of the second p-type base layer 7b illustrated in FIG. 3 of the first embodiment corresponds to the second n⁻-type base layer 7c in FIG. 12. The n-type impurity concentration of the second n⁻-type base layer 7c is identical with that of the n⁻-type drill layer 10. The second n⁻-type base layer 7c can be provided by performing photoengraving and not injecting ions of a p-type impurity in the region where the second n⁻-type base layer 7c provided, when a first p-type base layer 7a is formed.

In the fifth embodiment, all the base layers in contact with only the second control electrode 2a but not in contact with a first control electrode 1 as an active trench gate are made into the second n⁻-type base layers 7c; a second p-type base layer 7b, however, may be formed by injecting ions of a p-type impurity into one or some of the base layers in contact with only the second control electrode 2a. That is, at least one base layer of the base layers in contact with only the second control electrode 2a should be the second n⁻-type base layer 7c.

In a semiconductor apparatus 100 according to the fifth embodiment, the second n-type base layer 7c is, as illustrated in FIG. 13, provided by not injecting ions of a p-type impurity in the region where the second n-type base layer 7c is provided to make it difficult for holes to enter the second n-type base layer 7c at the time of turn-on of the IGBT element 20. This makes many holes to flow into the first p-type base layer 7a to increase the conductivity modulation effect, reducing the conduction loss of the IGBT element 20.

Further, the amount of holes accumulated in the second n⁻-type base layer 7c in contact with only the second control electrode 2a is reduced to decrease the degree of the rise in electric potential ΔVdp generated at the time of turn-on of the IGBT element 20. This can reduce the amount of the displacement current Id that can be generated by the rise in electric potential ΔVdp to further increase the controllability of the dV/dt at the time of turn-on and suppress the false turn-on at the time of turn-off of the IGBT element. In a case in which one or some of the base layers in contact with only the second control electrode 2a are the second p-type base layers 7b, the amount of holes accumulated in all the base layers in contact with only the second control electrode 2a can also be reduced in the same manner to further increase the controllability of the dV/dt at the time of turn-on and suppress the false turn-on at the time of turn-off of the IGBT element.

In the fifth embodiment, described is a configuration applied to the first embodiment. The configurations described in the second to fourth embodiments, however, may be applied to the semiconductor apparatus including the second n-type base layer 7c and the dummy trench gate that are described in the present embodiment, and such a semiconductor apparatus can give the same effects as those of the semiconductor apparatuses described in the second to fourth embodiments.

Sixth Embodiment

FIG. 14 is an enlarged structure cross-sectional view illustrating an element peripheral portion of an IGBT element constituting a semiconductor apparatus according to a sixth embodiment of the present invention. In FIG. 14, a component having the same reference sign as the reference sign of a component in FIG. 3 has the identical configuration with or a configuration corresponding to the configuration of the component in FIG. 3, and the description for the component is omitted. The sixth embodiment is different from the first embodiment according to the present invention in that the semiconductor apparatus has a configuration of integrally forming a diode 21 and an IGBT element 20. FIG. 14 is, in contrast to FIG. 11 of the third embodiment, a cross-sectional view along a second control electrode 2.

As illustrated in FIG. 14, in the IGBT element 20 of a semiconductor apparatus 100 according to the sixth embodiment, trench gates formed of a first control electrode 1 and the second control electrode 2 are configured to include a trench gate electrode 15a made of n-type polysilicon. On the other hand, a wiring portion 15b, which is made of p-type polysilicon is formed in a part of a gate wiring portion of the element peripheral portion of the IGBT element 20. This forms, in the gate wiring portion, a pn junction in a junction portion between the trench gate electrode 15a made of n-type polysilicon and the wiring portion 15b made of p-type polysilicon, and this pn junction constitutes the diode 31. Further, a second gate pad 19 is formed on the wiring portion 15b, which is made of p-type polysilicon, in the gate wiring portion to connect the wiring portion 15b to the second gate pad 19.

On the other hand, the p-type polysilicon described above is not formed in a gate wiring portion of the trench gate electrode 15a, which is made of n-type polysilicon, of the first control electrode 1, and a first gate pad is formed on the wiring portion of the trench gate electrode 15a that is made of n-type polysilicon to connect the wiring portion of the first control electrode to the first gate pad. The first gate pad is connected to the second gate pad 19, and one end of a gate resistor 22 is connected to this connection between the first gate pad and the second gate pad. This gives the semiconductor apparatus 100 having a configuration of connecting cathodes of the diodes 21 to the second control electrodes 2, respectively, connecting anodes of the diodes 21 to the first control electrode 1, and connecting one end of a gate resistor 22 to this connection between the diodes 21 and the first control electrode 1, in the same manner as in the configuration illustrated in FIG. 7 of the first embodiment.

Figure 15:
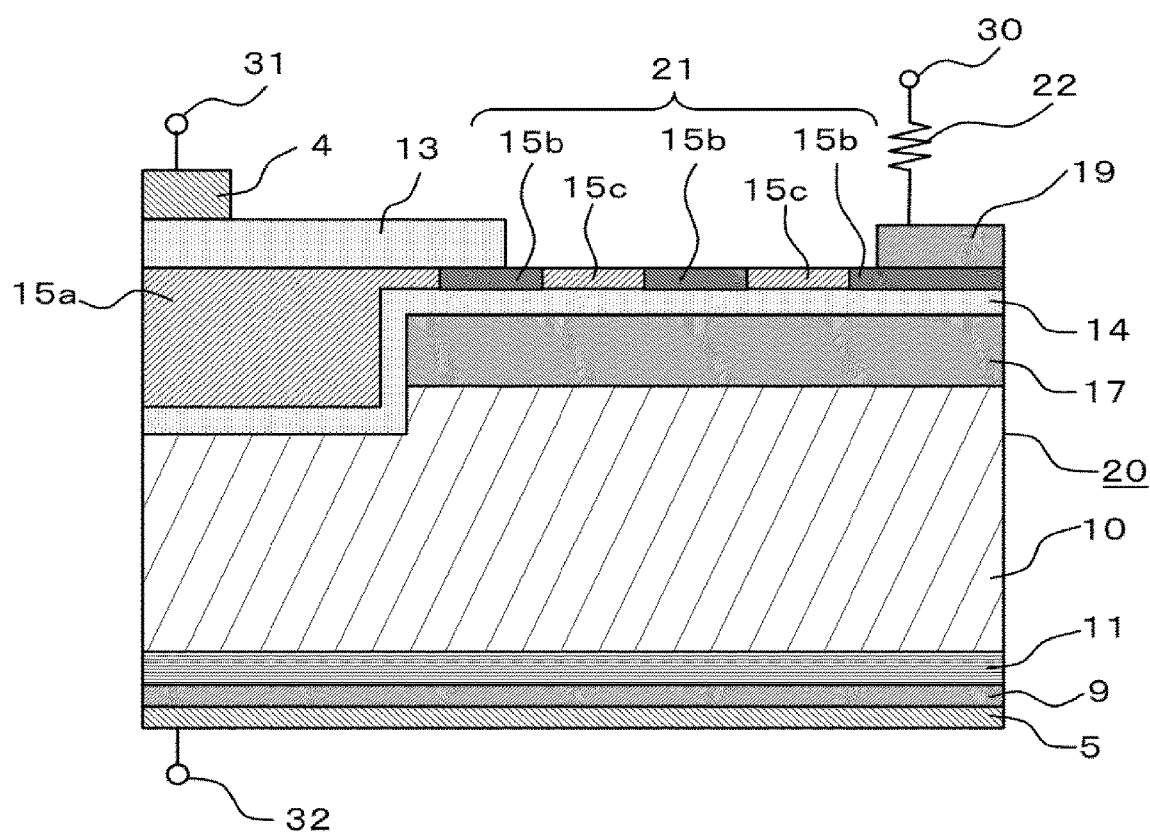
FIG. 15 is an enlarged structure cross-sectional view illustrating an element peripheral portion of an IGBT element that constitutes a semiconductor apparatus having another configuration according to the sixth embodiment of the present invention.

FIG. 15 is an enlarged structure cross-sectional view illustrating an element peripheral portion of an IGBT element that constitutes a semiconductor apparatus having another configuration according to the sixth embodiment of the present invention. A semiconductor apparatus 100 in FIG. 15 is different from the semiconductor apparatus in FIG. 14 in that it has a configuration of forming a plurality of diodes connected in series in a gate wiring portion, which is made of polysilicon, of a second control electrode 2. FIG. 15 is, as with FIG. 14, a cross-sectional view along the second control electrode 2.

As illustrated in FIG. 15, in the semiconductor apparatus 100, a plurality of (three) wiring portions 15b made of p-type polysilicon and wiring portions 15c made of n-type polysilicon are formed in a gate wiring portion of a trench gate electrode 15a that constitutes the second control electrode 2 and is made of n-type polysilicon. The wiring portions 15c are integrally formed simultaneously with the trench gate electrode 15a made of n-type polysilicon. Regions between the wiring portions 15b made of p-type polysilicon are the wiring portions 15c made of n-type polysilicon. This forms three pn junctions that are junction portions between p-type polysilicon and n-type polysilicon to constitute a diode 21 configured to include three diodes connected in series. A second gate pad 19 is formed on a wiring portion 15b made of p-type polysilicon to connect the second gate pad 19 to the wiring portion 15b.

No p-type polysilicon is formed in a gate wiring portion of the trench gate electrode 15a, which is made of n-type polysilicon, of a first control electrode 1, giving the identical configuration with that of the semiconductor apparatus in FIG. 14. This gives the semiconductor apparatus 100 having a configuration of connecting a cathode of the diode 21, which includes the plurality of diodes connected in series, to the second control electrodes 2, connecting an anode of the diode 21, which includes the plurality of diodes connected in series, to the first control electrode 1, and connecting one end of a gate resistor 22 to this connection between the diode 21 and the first control electrode 1, in the same manner as in the semiconductor apparatus in FIG. 8. Such a configuration can decrease the parasitic capacitance of the diode 21, in comparison with that of the semiconductor apparatus in FIG. 14, by connection of the plurality of diodes in series.

The semiconductor apparatuses illustrated in FIGS. 14 and 15 can be produced by the following steps, for example. The trench gate electrode 15a made of n-type polysilicon is deposited on an n⁻-type semiconductor substrate and subjected to photoengraving to open only a predetermined region of the gate wiring portion of the second control electrode 2. Into this region are injected ions of a p-type impurity such as boron (B) to form the wiring portion 15b made of p-type polysilicon.

As described above, in the semiconductor apparatuses according to the sixth embodiment, it is possible to incorporate, in the IGBT element 20, the diode 21 to be provided between the first control electrode 1 and the second control electrode 2. This makes it possible to increase the controllability of the dV/dt at the time of turn-on and suppress the false turn-on at the time of turn-off of the IGBT element 20, without increasing the number of components. Further, this makes it possible to downsize a semiconductor apparatus and give a semiconductor apparatus high in reliability that does not cause disconnection firing between the IGBT element 20 and the diode 21.

In the first to sixth embodiments, a material for the semiconductor substrate has been described as silicon. The material for the semiconductor substrate, however, is not limited to silicon, but may be materials such as gallium nitride, silicon carbide, aluminum nitride, diamond, and gallium oxide.

EXPLANATION OF REFERENCE SIGNS

1: First control electrode
2, 2a: Second control electrode
3: Third control electrode
6: n⁺-type emitter layer
7: p-type base layer
7a: First p-type base layer
7b: Second p-type base layer
7c: Second n⁻-type base layer
9: p⁺-type contact layer
10: n⁻-type drift layer
12: p-type collector layer
14: Gate insulating film
15, 15a: Trench gate electrode
15b, 15c: Wiring portion
16: Trench
20: IGBT element
21, 21a, 21b: Diode
22: Gate resistor
100: Semiconductor apparatus

The invention claimed is:

1. A semiconductor apparatus comprising:
an n-type drift layer;
a p-type base layer provided on a top surface side of the drift layer;
an n-type emitter layer selectively provided on a top surface side of the base layer;
a trench gate that allows a trench gate electrode to be in contact with the emitter layer, the base layer, and the drift layer via a gate insulating film, the trench gate electrode being embedded so as to reach from a surface layer of the emitter layer to the drift layer;
a dummy trench gate that allows a dummy trench gate electrode to be in contact with the base layer and the drift layer via a gate insulating film, the dummy trench gate electrode being embedded so as to reach from a surface layer of the base layer to the drift layer;
a p-type collector layer provided on a bottom surface side of the drift layer; and
a diode whose anode side and cathode side are electrically connected to the trench gate electrode and the dummy trench gate electrode, respectively.

2. The semiconductor apparatus according to claim 1, comprising a plurality of the dummy trench gates, wherein one or some of the plurality of the dummy trench gate electrodes are electrically connected to an emitter electrode provided on the emitter layer and the other of the dummy trench gate electrodes is/are electrically connected to the cathode side of the diode.

3. The semiconductor apparatus according to claim 1, wherein
the dummy trench gate electrode is formed of an n-type semiconductor and has a wiring portion that is connected to a second gate pad provided on the top surface side of the drift layer, and
the diode is formed of a pn junction of a p-type semiconductor and the n-type semiconductor that are provided in a part of the wiring portion.

4. The semiconductor apparatus according to claim 1, wherein the diode includes a plurality of diodes connected in series.

5. The semiconductor apparatus according to claim 1, wherein the trench gate electrode is connected to the anode side of the diode via a resistor.

6. The semiconductor apparatus according to claim 5, wherein
the trench gate electrode is formed of a semiconductor containing an impurity and has a wiring portion that is connected to a first gate pad provided on the top surface side of the drift layer, and
the resistor is formed of a region that is provided in the wiring portion and has a lower impurity concentration than in the trench gate.

7. A semiconductor apparatus comprising:
an n-type drift layer;
a p-type base layer selectively provided on a top surface side of the drift layer;
an n-type emitter layer provided on a top surface side of the base layer;
a trench gate that allows a trench gate electrode to be in contact with the emitter layer, the base layer, and the drift layer via a gate insulating film, the trench gate electrode being embedded so as to reach from a surface layer of the emitter layer to the drift layer;
a dummy trench gate that allows a dummy trench gate electrode to be in contact with the drift layer via a gate insulating film, the dummy trench gate electrode being embedded from a surface layer of the drift layer to an inside of the drift layer;

a p-type collector layer provided on a bottom surface side of the drift layer; and a diode whose anode side and cathode side are electrically connected to the trench gate electrode and the dummy trench gate electrode, respectively.

8. The semiconductor apparatus according to claim 7, comprising a plurality of the dummy trench gates, wherein one or some of the plurality of the dummy trench gate electrodes are electrically connected to an emitter electrode provided on the emitter layer and the other of the dummy trench gate electrodes is/are electrically connected to the cathode side of the diode.

9. The semiconductor apparatus according to claim 7, wherein the dummy trench gate electrode is formed of an n-type semiconductor and has a wiring portion that is connected to a second gate pad provided on the top surface side of the drift layer, and the diode is formed of a pn junction of a p-type semiconductor and the n-type semiconductor that are provided in a part of the wiring portion.

10. The semiconductor apparatus according to claim 7, wherein the diode includes a plurality of diodes connected in series.

11. The semiconductor apparatus according to claim 7, wherein the trench gate electrode is connected to the anode side of the diode via a resistor.

12. The semiconductor apparatus according to claim 11, wherein the trench gate electrode is formed of a semiconductor containing an impurity and has a wiring portion that is connected to a first gate pad provided on the top surface side of the drift layer, and the resistor is formed of a region that is provided in the wiring portion and has a lower impurity concentration than in the trench gate.

* * * * *